(12) United States Patent
Park et al.

(10) Patent No.: US 12,315,542 B2
(45) Date of Patent: May 27, 2025

(54) MEMRISTOR ELEMENT WITH A MAGNETIC DOMAIN WALL IN A MAGNETIC FREE LAYER MOVED BY SPIN ORBIT TORQUE, SYNAPSE ELEMENT AND NEUROMORPHIC PROCESSOR INCLUDING THE SAME

(71) Applicant: Samsung Electronics Co., Ltd., Suwon-si (KR)

(72) Inventors: Jeong-Heon Park, Hwaseong-si (KR); Ung Hwan Pi, Hwaseong-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 11 days.

(21) Appl. No.: 17/684,573

(22) Filed: Mar. 2, 2022

(65) Prior Publication Data
US 2022/0293157 A1  Sep. 15, 2022

(30) Foreign Application Priority Data
Mar. 11, 2021 (KR) .................. 10-2021-0032042

(51) Int. Cl.
*G11C 11/16* (2006.01)
*G11C 11/18* (2006.01)
(52) U.S. Cl.
CPC ...... *G11C 11/1675* (2013.01); *G11C 11/1655* (2013.01); *G11C 11/1657* (2013.01); *G11C 11/1673* (2013.01); *G11C 11/1697* (2013.01); *G11C 11/18* (2013.01)
(58) Field of Classification Search
CPC ............ G11C 11/1675; G11C 11/1655; G11C 11/1657; G11C 11/1673; G11C 11/1697; G11C 11/18; G11C 11/2259; G11C 11/54; G11C 11/161; G06N 3/063; H10B 61/22; H10N 50/10

See application file for complete search history.

(56) References Cited

U.S. PATENT DOCUMENTS

| 9,152,827 | B2 | 10/2015 | Linderman et al. |
| 10,020,039 | B2 | 7/2018 | Fukami et al. |
| 10,608,169 | B2 | 3/2020 | Kim et al. |
| 10,622,048 | B2 | 4/2020 | Shiokawa et al. |

(Continued)

FOREIGN PATENT DOCUMENTS

| JP | 6414754 B2 | 10/2018 |
| KR | 10-2020-0099583 A | 8/2020 |

OTHER PUBLICATIONS

Examination report issued Nov. 27, 2024 in the Korean Application No. 10-2021-0032042.

*Primary Examiner* — Pho M Luu
(74) *Attorney, Agent, or Firm* — Harness, Dickey & Pierce, P.L.C.

(57) ABSTRACT

Disclosed are a memristor element, a synapse element and a neuromorphic processor including the same. The memristor element includes a free layer including a domain wall; and a fixed layer including a material of which a magnetization direction is fixed, wherein a position of the domain wall in the free layer is changeable based on a spin orbit torque (SOT) generated by a current introduced from an outside, and wherein a resistance value, measured through both ends of the fixed layer, is based on the position of the domain wall and on a Hall voltage.

20 Claims, 7 Drawing Sheets

(56) References Cited

U.S. PATENT DOCUMENTS

| | | | |
|---|---|---|---|
| 10,672,446 B2 | 6/2020 | Shibata et al. | |
| 10,680,166 B2 | 6/2020 | Yu et al. | |
| 11,690,299 B2 | 6/2023 | Sato et al. | |
| 2003/0011944 A1* | 1/2003 | Hosomi | G01R 33/093 365/158 |
| 2008/0231998 A1* | 9/2008 | Yoshikawa | G11C 11/16 360/313 |
| 2016/0247550 A1* | 8/2016 | Fukami | G11C 11/1675 |
| 2018/0301199 A1* | 10/2018 | Sasaki | H10B 61/20 |
| 2019/0035446 A1* | 1/2019 | Shibata | H01L 27/105 |
| 2020/0058339 A1 | 2/2020 | Hong et al. | |
| 2020/0126631 A1 | 4/2020 | Sasaki | |
| 2020/0134419 A1 | 4/2020 | Manipatruni et al. | |
| 2020/0136023 A1 | 4/2020 | Tsumita et al. | |

* cited by examiner

MEMRISTOR ELEMENT WITH A MAGNETIC DOMAIN WALL IN A MAGNETIC FREE LAYER MOVED BY SPIN ORBIT TORQUE, SYNAPSE ELEMENT AND NEUROMORPHIC PROCESSOR INCLUDING THE SAME

CROSS-REFERENCE TO RELATED APPLICATIONS

This application claims priority under 35 U.S.C. § 119 to Korean Patent Application No. 10-2021-0032042 filed on Mar. 11, 2021, in the Korean Intellectual Property Office, the disclosures of which are incorporated by reference herein in their entireties.

BACKGROUND

Embodiments of the present disclosure described herein relate to a semiconductor device, and more particularly, relate to a memristor element that implements multi-state based on a spintronics, a synapse element including the same, and a neuromorphic processor including the same.

Recently, interest in artificial intelligence (AI) technology, which is a core technology of the fourth industrial revolution, is increasing. As AI technology develops, there is an urgent need for semiconductor devices dedicated to the demand for artificial intelligence to learn vast amounts of data and to recognize objects and/or to decide actions based on the results. Conventional computing methods are suitable for processing limited data at high speed, but it is difficult to apply the conventional computing method to the artificial intelligence technology that can process and analyze enormous amounts of data by itself. Therefore, a neuromorphic computing method that simulates a neural network of a neurological system (e.g., the human brain) has been suggested as an alternative to the conventional computing method. Such systems may be referred to as neuromorphic.

The neuromorphic computing method may process vast amounts of data with low power without delay using an element that mimics neurons (and that act as a processor) and an element that mimics synapses (and that acts as a memory). For example, the element that mimics the synapse should be capable of expressing the intensity of synapse signals in several stages while having a non-volatile characteristic in which information does not disappear and should be able to easily implement a learning method that the synapse actually performs. A memristor element, which simultaneously has a characteristic of a transistor whose resistance value changes according to an applied voltage and a memory characteristic of storing the resistance value for a certain period of time, is evaluated as a suitable element for implementing such a neuromorphic computing method.

SUMMARY

Embodiments of the present disclosure provide a memristor element that performs domain wall movement by a spin orbit torque (SOT), a synapse element including the memristor element, and a neuromorphic processor.

According to an embodiment of the present disclosure, a memristor element includes a free layer including a domain wall; and a fixed layer including a material of which a magnetization direction is fixed, wherein a position of the domain wall in the free layer is changeable based on a spin orbit torque (SOT) generated by a current introduced from an outside, and wherein a resistance value, measured through both ends of the fixed layer, is based on the position of the domain wall and on a Hall voltage.

According to an embodiment of the present disclosure, a synapse element includes at least one transistor; and at least one memristor element electrically connected to the at least one transistor and configured to store a weight for an artificial neural network operation, and wherein the at least one memristor element includes a free layer a domain wall; and a fixed layer including a material of which a magnetization direction is fixed, and wherein a position of the domain wall which is changeable based on a spin orbit torque (SOT) generated by a current introduced from an outside, wherein a resistance value, measured through both ends of the fixed layer, is based on the position of the domain wall and on a Hall voltage.

According to an embodiment of the present disclosure, a neuromorphic processor includes a synapse element array including a plurality of synapse elements, wherein each of the plurality of synapse elements includes a first memristor element including a free layer including a domain wall, and a fixed layer including a material of which a magnetization direction is fixed, wherein a position of the domain wall in the free layer is changeable based on a spin orbit torque (SOT) generated by a current introduced from an outside, and wherein a resistance value, measured through both ends of the fixed layer, is based on the position of the domain wall and on a Hall voltage.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
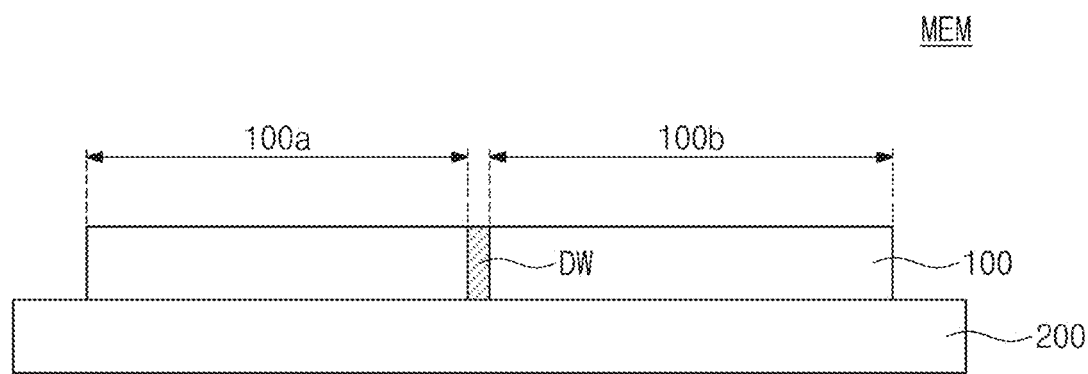
FIG. 1 is 1 is a cross-sectional view of a memristor element according to some example embodiments of the present disclosure.

Hereinafter, example embodiments of the present disclosure will be described clearly and in detail such that those skilled in the art may easily carry out the present disclosure.

The terms used in the present specification are for describing example embodiments, and are not intended to limit the present disclosure. In the present specification, the singular form also includes the plural form unless otherwise specified in the phrase. As used herein, "comprises and/or comprising" does not exclude the presence or addition of one or more other components, steps, operations and/or elements to the mentioned components, steps, operations and/or elements.

Although the terms "first", "second", etc. may be used herein to describe various elements, such elements should not be construed as being limited by these terms. These terms are only used to distinguish one element from the other. For example, a first element may be referred to as a second element, without departing the scope of the present disclosure, and similarly, a second element may be referred to as a first element.

Unless otherwise defined, all terms (including technical and scientific terms) used in the present specification may be used as meanings commonly understood by those skilled in the art to which the present disclosure pertains. In addition, terms defined in the commonly used dictionary are not interpreted ideally or excessively unless explicitly defined specifically. In the present specification, the same reference numerals may refer to the same components throughout the entire text.

FIG. 1 is a cross-sectional view of a memristor element MEM according to some example embodiments of the present disclosure. The memristor element MEM may include a free layer 100 and a fixed layer 200. The free layer 100 may include a material of which a magnetization direction may be changed by an external stimulation. The fixed layer 200 may include a material of which the magnetization direction is fixed.

The free layer 100 may include a domain wall DW that is formed with a magnetic material. The domain wall DW is a boundary region between magnetic domains having different magnetization directions. The domain wall may be an interface that may be moved by an external magnetic field and/or a current. For example, in FIG. 1, the magnetic domains included in a first region 100a of the free layer 100 and the magnetic domains included in a second region 100b of the free layer 100 are magnetic domains having different magnetization directions, and the domain wall DW may be formed at the boundary of the magnetic domains. In some embodiments of the present disclosure, the domain wall DW may move based on a spin current injected by a spin orbit torque (SOT).

The memristor element MEM may be classified as an in-plane magnetic element or a perpendicular magnetic element depending on the magnetic anisotropy direction of the free layer 100. For example, the in-plane magnetic element may be classified as an x-type element in which the magnetic direction of the free layer 100 and the direction of a spin orbit torque writing line are parallel to each other, and/or a y-type element in which the magnetic direction of the free layer 100 and the direction of the spin orbit torque writing line are perpendicular to each other. The perpendicular magnetic element may be classified as a z-type element.

In some embodiments, the free layer 100 may include a magnetic metal such as cobalt (Co), iron (Fe), nickel (Ni), and/or an alloy thereof. For example, the free layer 100 may include a magnetic material of the CoFeB series used in a magnetic tunnel junction (MTJ) device of a magnetic random access memory (MRAM) and/or a magnetic material of the CoFeB series that is doped with a non-magnetic metal. In some embodiments, the free layer 100 may include a synthetic antiferromagnet (SAF) material for performing a domain wall movement at low power. In this case, an adjacent layer of a tunnel barrier may include Co, Fe, Ni, an alloy thereof, and/or a CoFeB-based magnetic material for a high magnetic resistance ratio. The perpendicular magnetic element may include, for example, a magnetic metal and/or a multilayer structure. In some embodiments, the multilayer structure may include alternating layers of a magnetic metal and another metal. For example, the perpendicular magnetic element may include at least one of a CoPt alloy, a CoIPt multilayer, a CoINi multilayer, a CoIIr multilayer, and/or a mixture layer thereof. In some embodiments, the perpendicular magnetic element includes at least one of a ruthenium (Ru) layer, a iridium (Ir) layer, a rhodium (Rh) layer, a tantalum (Ta) layer, a tungsten (W) layer, and/or a composite layer thereof.

The fixed layer 200 may include a material for performing a write operation based on a spin orbit torque and a read operation based on a Hall voltage. For example, the fixed layer 200 may include heavy metals such as lead (Pt), tungsten (W), tantalum (Ta), and/or an alloy thereof (e.g., TaB, PdPt, AuPt, and/or Pt/Hf), which have a large spin Hall angle and a large spin capacity. Alternatively, the fixed layer 200 may include a topological insulator material such as $Bi_xSe_{(1-x)}$, $Bi_xSb_{(1-x)}$, and/or Sb. Alternatively, in some embodiments, the fixed layer 200 may include a Weyl semimetal such as WTex. In order to increase a Hall voltage signal, the fixed layer 200 may include a metal iridate, such as $SrIrO_3$, and/or an oxide layer obtained by oxidizing a (e.g., one) layer of a ferromagnet (FM)/heavy metal bilayer.

The memristor element MEM may implement a variable resistance based on the movement of the domain wall DW by the spin orbit torque. The memristor element MEM may electrically read the movement of the domain wall DW, thereby securing high speed, low power, and high durability characteristics. In addition, a multi-state element may be implemented based on the movement of the domain wall DW, and non-volatile characteristics may be secured since information on where the domain wall DW is stopped is stored even when power to the memristor element MEM is turned off.

Figure 2:
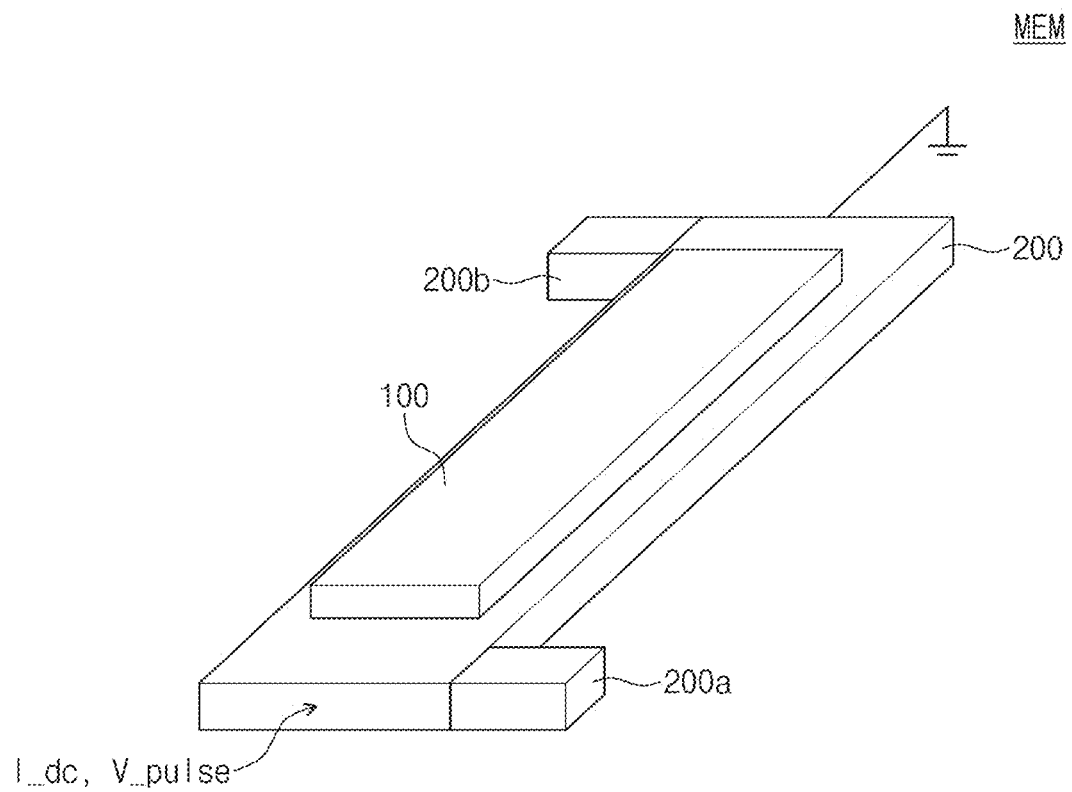
FIG. 2 is a diagram describing an operation method of a memristor element according to some example embodiments of the present disclosure.

FIG. 2 is a diagram describing an operation method of the memristor element MEM according to some example embodiments of the present disclosure. The memristor element MEM, according to the present disclosure, may perform a write operation (e.g., for assigning a weight used for an artificial neural network operation) and a read operation (e.g., for fetching a weight stored in the memristor element MEM). In FIG. 2, a first protrusion 200a and a second protrusion 200b of the fixed layer 200 are illustrated, but these are for convenience of description and are not intended to limit a structure of the memristor element MEM.

The write operation of the memristor element MEM may be implemented by generating the movement of the domain wall DW (refer to FIG. 1). As described above, the domain wall DW may move based on the spin current injected by the spin orbit torque. In some embodiments, the spin orbit torque may be generated by introducing a current I_dc from the outside. When the current I_dc flows in, spin polarization occurs due to a Lashva effect and/or a spin Hall effect. For example, when the spin polarization occurs due to the spin Hall effect, which may denote a phenomenon in which a flow direction for electrons (having spin) is shifted according to a direction of spin of the electron, and as a result, spin-accumulation may occur in a direction lateral to the flow direction (e.g., in the case of an up spin, spins may be accumulated in one direction, and in the case of a down spin, spins may be accumulated in a direction opposite to the one direction).

In this case, the spin orbit torque may be generated by the accumulation of spin-polarized electrons in the memristor (e.g., in the fixed layer 200 and/or the free layer 100 and/or at an interface between the fixed layer 200 and/or the free layer 100) and may, by applying a spin-orbit torque, change the direction of a magnetic dipoles in one of the first region 100a and/or second region 100b, thereby changing the position of the domain wall DW based on the direction of spin of the accumulated electrons with a spin direction. Therefore, as spin pumping occurs, a spin current may flow into the free layer 100, and the domain wall DW of the free layer 100 may be moved by the spin current. A resistance value of the memristor element MEM may be determined depending on the movement and/or position of the domain wall DW.

The read operation of the memristor element MEM may be performed by measuring the Hall voltage that is generated by introducing a voltage V_pulse from the outside and which is based on the movement and/or position of the domain wall DW. For example, the recorded weight may be read by measuring the Hall voltage between the first protrusion 200a and the second protrusion 200b of the fixed layer 200 of the memristor element MEM. A relationship between a resistance change of the memristor element MEM according to the movement and/or position of the domain wall DW and the Hall voltage measured therefrom will be described in detail with reference to FIG. 3 to be described below.

Figure 3:
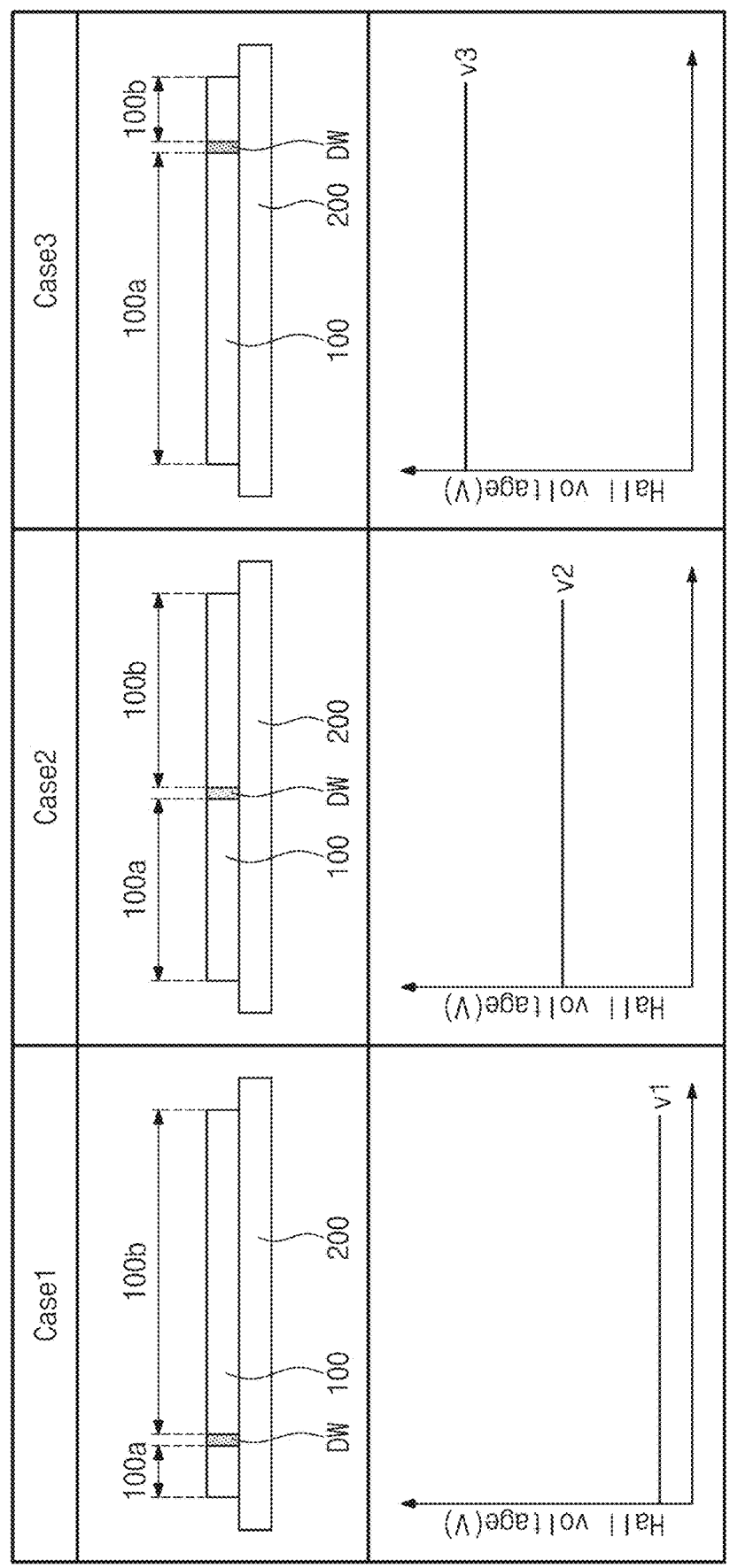
FIG. 3 is a diagram describing a change in resistance of a memristor element according to a movement of a domain wall in a memristor element according to some example embodiments of the present disclosure.

FIG. 3 is a diagram describing a change in resistance of the memristor element MEM according to a movement and/or position of the domain wall DW in the memristor element MEM (refer to FIG. 1) according to some example embodiments of the present disclosure. For convenience of description, in the following description the spin direction of the magnetic domains included in the first region 100a of the free layer 100 is different from the spin direction of the fixed layer 200, and the spin direction of the magnetic domains included in the second region 100b of the free layer 100 is the same as the spin direction of the fixed layer 200.

Referring to FIG. 3, in the case of Case 1 where an area of the first region 100a of the free layer 100 with respect to the fixed layer 200 is less than an area of the second region 100b, the Hall voltage is measured as 'v1'. In the case of Case 2 where the area of the first region 100a of the free layer 100 with respect to the fixed layer 200 is the same as the area of the second region 100b, the Hall voltage is measured as 'v2'. In the case of Case 3 where the area of the first region 100a of the free layer 100 with respect to the fixed layer 200 is larger than the area of the second region 100b, the Hall voltage is measured as 'v3'.

In some embodiments according to the present disclosure, as the area in which the spin direction of the magnetic domains included in the free layer 100 changes as the spin direction of the magnetic domains included in the fixed layer 200 increases, a measured Hall voltage may increase. The Hall voltages measured in the Cases 1 to 3 have magnitudes of v1<v2<v3. Though illustrated as including three Hall voltages, v1, v2, and v3, the magnitudes of the Hall voltages is not so limited, and the memristor may include more or less magnitudes of Hall voltages depending on the movement and/or position of the domain wall DW. Therefore, since the resistance value of the memristor element MEM changes depending on the movement and/or position of the domain wall DW, the measured Hall voltage may vary depending on the corresponding resistance value, and the memristor element MEM may store multi-state information. For example, in this case, the memristor element MEM may store more information than a binary system (e.g., may store information which is not binary information) and/or which may be used to store, e.g., weights in an artificial intelligence operation.

Figure 4:
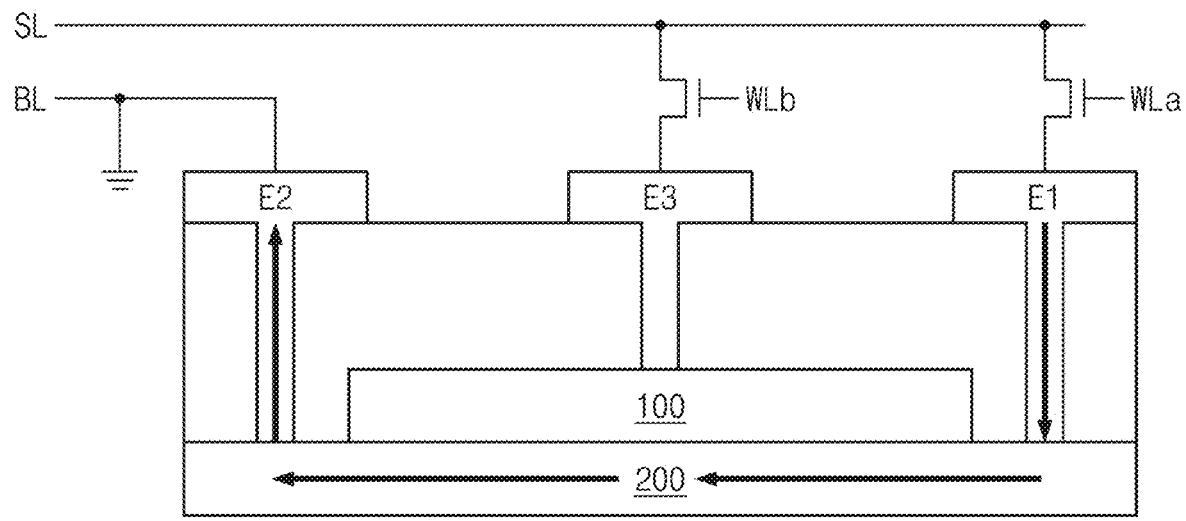
FIG. 4 is a diagram illustrating a current path for a write operation in a memristor element according to some example embodiments of the present disclosure.

FIG. 4 is a diagram illustrating a current path for a write operation in the memristor element MEM (refer to FIG. 1) according to some example embodiments of the present disclosure. Referring to FIG. 4, first to third electrodes E1, E2, and E3 may be coupled to the memristor element MEM. The first and second electrodes E1 and E2 may be joined to (e.g., electrically connected to) the fixed layer 200 of the memristor element MEM, and the third electrode E3 may be joined to (e.g., electrically connected to) the free layer 100 of the memristor element MEM.

When the memristor element MEM performs the write operation, a first transistor connected to a first word line WLa is turned on to supply a current from a source line SL. In addition, when the memristor element MEM performs the write operation, a second transistor connected to a second word line WLb is turned off to electrically separate the third electrode E3 from the source line SL. The supplied current may be injected into the fixed layer 200 through the first electrode E1 and discharged to a ground node through the second electrode E2 and a bit line BL. The spin orbit torque may be generated by a spin polarization generated based on the current flowing into the fixed layer 200. Spin pumping occurs due to the spin orbit torque, and a spin current may flow into the free layer 100. Therefore, the domain wall DW (refer to FIG. 1) of the free layer 100 may move by the spin current. A resistance value of the memristor element MEM may be determined depending on the movement of the domain wall DW.

Figure 5:
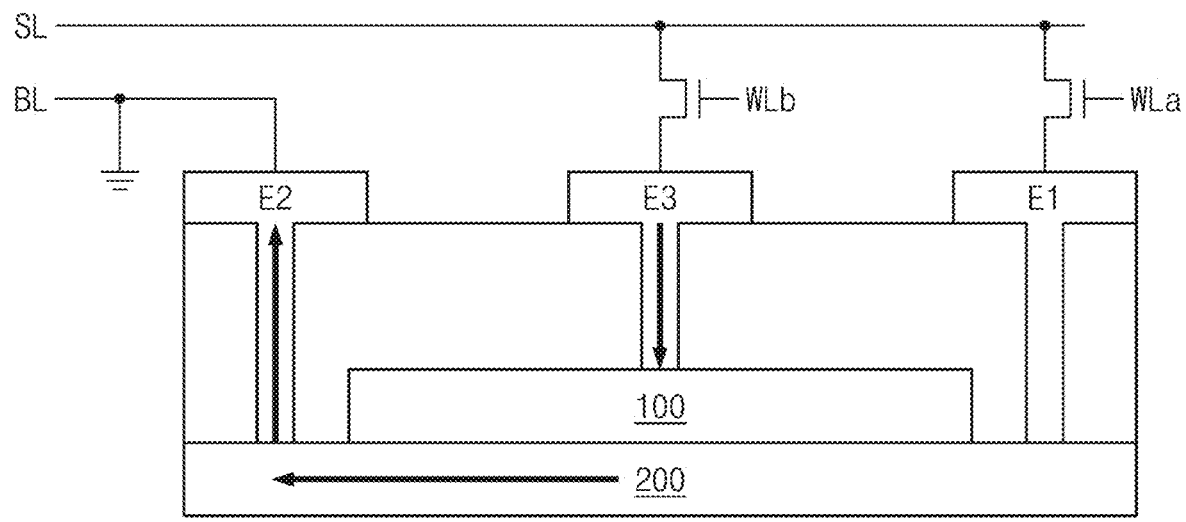
FIG. 5 is a diagram illustrating a voltage path for a read operation in a memristor element according to some example embodiments of the present disclosure.

FIG. 5 is a diagram illustrating a voltage path for a read operation in the memristor element MEM (refer to FIG. 1) according to some example embodiments of the present disclosure. When the memristor element MEM performs the read operation, the first transistor connected to the first word line WLa is turned off, such that the first electrode E1 may be electrically separated from the source line SL. In addition, the second transistor connected to the second word line WLb is turned on to supply a voltage from the source line SL to the third electrode E3. The supplied voltage may be injected into the free layer 100 through the third electrode E3 and may be discharged to the ground node through the second electrode E2 and the bit line BL. The voltage introduced into the free layer 100 may cause a voltage drop due to the resistance value of the memristor element MEM according to the position of the domain wall DW formed in the free layer 100. Accordingly, the weight recorded in the memristor element MEM may be read through the measurement of the Hall voltage between the third electrode E3 and the second electrode E2.

Figure 6:
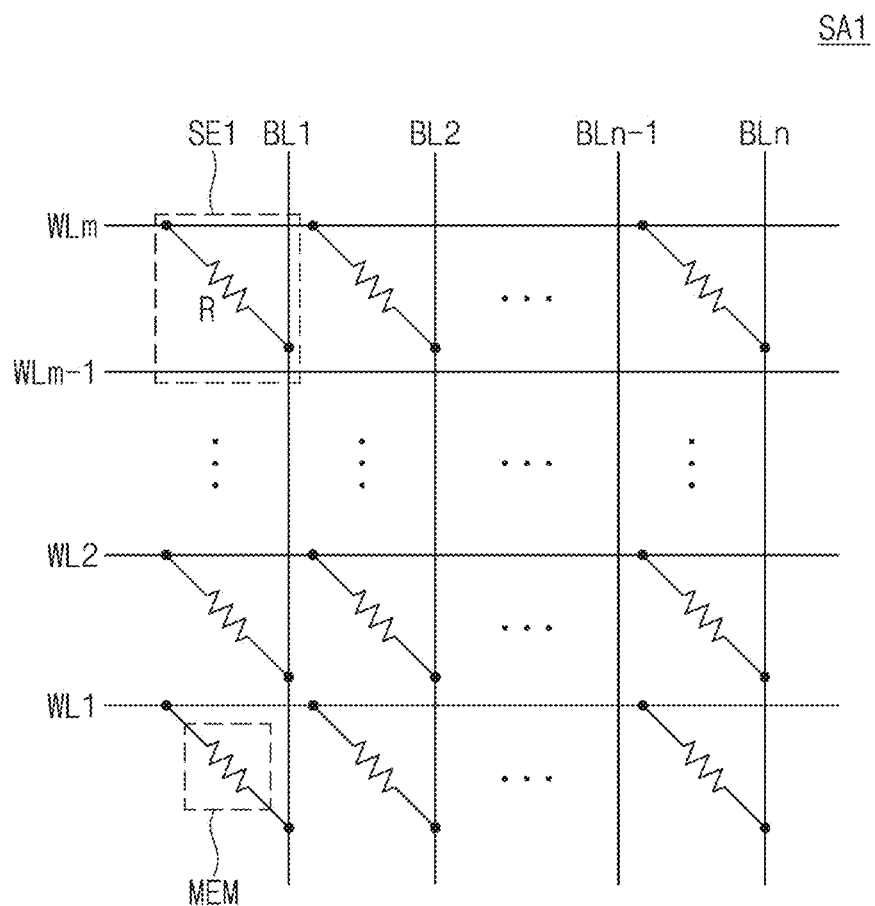
FIG. 6 is a diagram illustrating a synapse element array composed of a synapse element implemented as a memristor element according to some example embodiments of the present disclosure.

FIG. 6 is a diagram illustrating a synapse element array SA1 of a first example embodiment composed of a synapse element SE1 implemented as the memristor element MEM (refer to FIG. 1) according to some example embodiments of the present disclosure. The artificial neural network operation may be expressed as a continuation of matrix multiplication, and to implement this first embodiment the synapse element array SA1 of the first embodiment may be implemented with the synapse element SE1 including the memristor element MEM according to the present disclosure. In FIG. 6, a resistance value R represents a variable resistance value that is determined based on the position of the domain wall DW (refer to FIG. 1) of the memristor element MEM.

In FIG. 6, the synapse element SE1 may include a word line WLm, a bit line BL1, and the memristor element MEM. For example, one end of the memristor element MEM (refer to FIG. 1) may be connected to the word line WLm, and the other end may be connected to the bit line BL1. The synapse element SE1 may be arranged in rows and columns to form the synapse element array SAE In the artificial neural network operation, each of the memristor elements MEM included in the synapse element array SA1 may store a weight, and the synapse element array SA1 may perform an artificial neural network operation based on the stored weights. For example, the weight may be derived by calculating a voltage input into the word lines WL1, WL2, WLm (where m represents a natural number) and a current value output from the bit lines BL1, BL2, . . . , BLn (where n represents a natural number).

Figure 7:
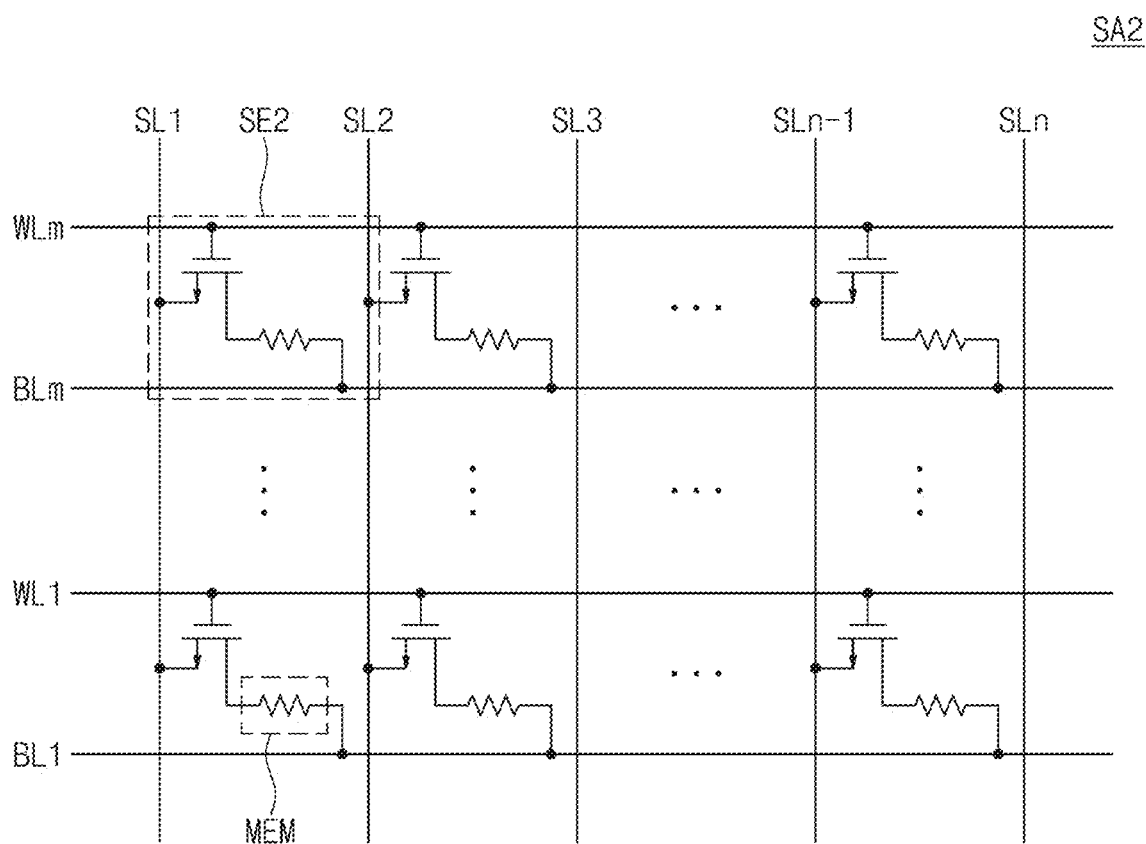
FIG. 7 is a diagram illustrating a synapse element array composed of a synapse element including a memristor element according to some example embodiments of the present disclosure.

FIG. 7 is a diagram illustrating a synapse element array SA2 of a second example embodiment composed of a synapse element SE2 of the second embodiment including the memristor element MEM (refer to FIG. 1) according to some example embodiments of the present disclosure. In FIG. 7, the resistance value R represents a variable resistance value determined based on the position of the domain wall DW (refer to FIG. 1) of the memristor element MEM.

In FIG. 7, the synapse element SE2 may include the word line WLm, the bit line BL1, one transistor Tr, and the memristor element MEM. A first terminal of the transistor Tr may be connected to the word line WLm, and a second terminal of the transistor Tr may be connected to a source line SL1. In addition, a third terminal of the transistor Tr may be connected to one end of the memristor element MEM, and another end of the memristor element MEM may be connected to the bit line BLm. The synapse element SE2 may be arranged in rows and columns to form the synapse element array SA2.

Figure 8:
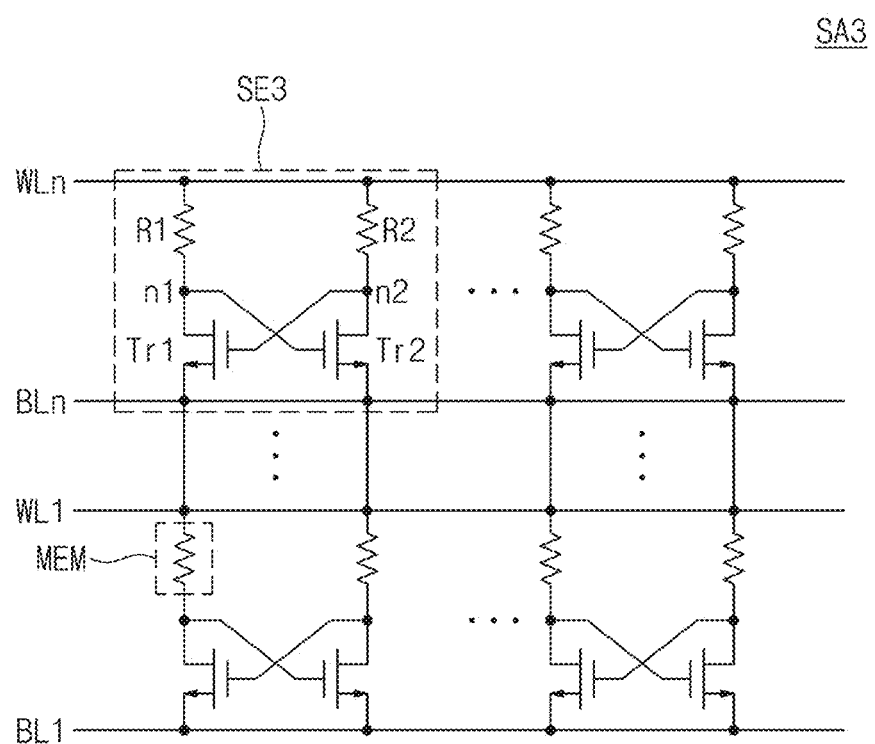
FIG. 8 is a diagram illustrating a synapse element array composed of another synapse element including a memristor element according to some example embodiments of the present disclosure.

FIG. 8 is a diagram illustrating a synapse element array SA3 of a third example embodiment composed of a synapse element SE3 of the third embodiment including the memristor element MEM according to some example embodiments of the present disclosure. In FIG. 8, each of the first resistance value R1 and the second resistance value R2 represent a variable resistance value determined based on the position of the domain wall DW (refer to FIG. 1) of the memristor element MEM.

In FIG. 8, the synapse element SE3 may include a word line WLn, a bit line BLn, first and second transistors Tr1 and Tr2, and first and second memristor elements MEM. One end of the first memristor element MEM having the first resistance value R1 may be connected to the word line WLn, and another end of the first memristor element MEM may be connected to a first node n1. One end of the second memristor element MEM having the second resistance value R2 may be connected to the word line WLn, and another end of the second memristor element MEM may be connected to a second node n2.

A first terminal of the first transistor Tr1 may be connected to the first node n1, a second terminal of the first transistor Tr1 may be connected to the second node n2, and a third terminal of the first transistor Tr1 may be connected to the bit line BLn. A first terminal of the second transistor Tr2 may be connected to the second node n2, a second terminal of the second transistor Tr2 may be connected to the first node n1, and a third terminal of the second transistor Tr2 may be connected to the bit line BLn. The synapse element SE3 may be arranged in rows and columns to form the synapse element array SA3.

Figure 9:
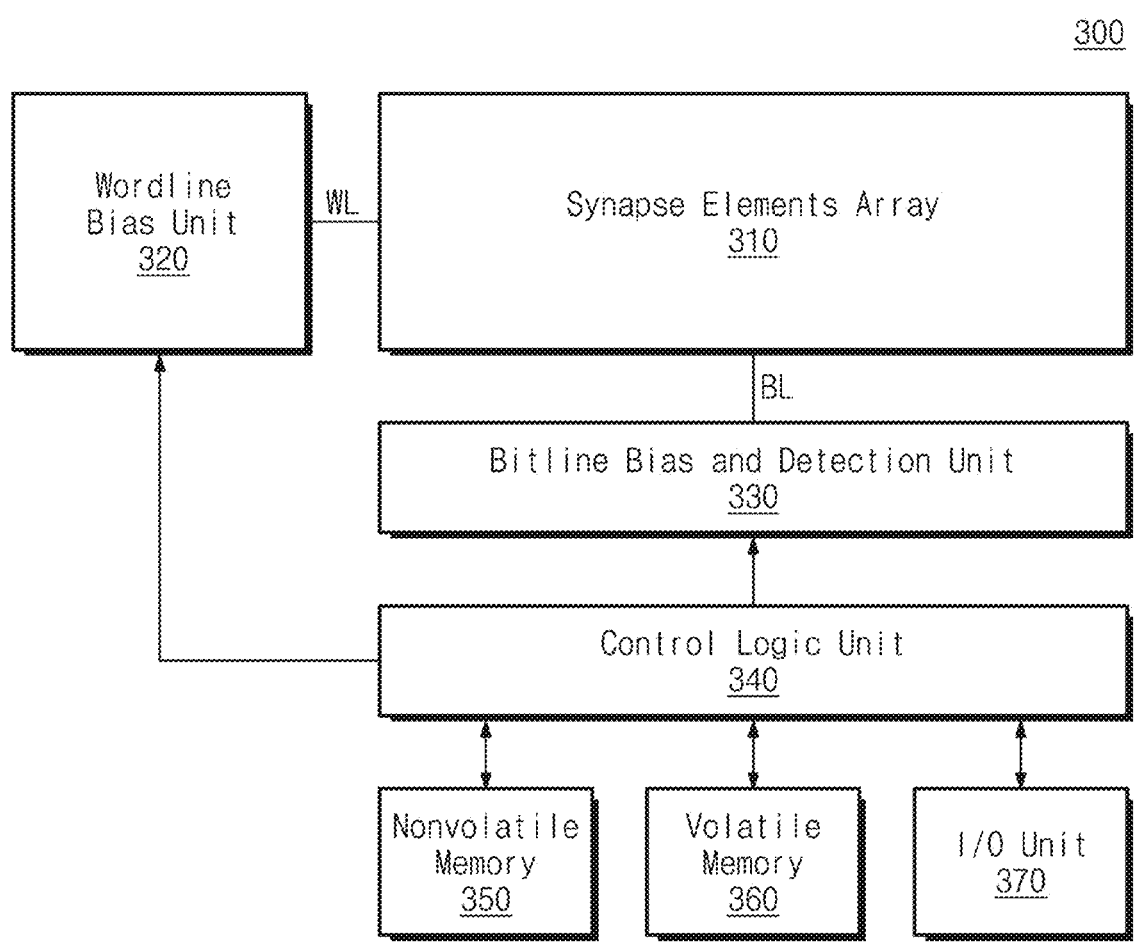
FIG. 9 is a diagram illustrating a neuromorphic processor including a memristor element according to some example embodiments of the present disclosure.

FIG. 9 is a diagram illustrating a neuromorphic processor 300 including the memristor element MEM according to some example embodiments of the present disclosure. Referring to FIG. 9, the neuromorphic processor 300 may include a synapse elements array 310, a word line bias unit 320, a bit line bias and detection unit 330, a control logic unit 340, a nonvolatile memory 350, a volatile memory 360, and an input/output (I/O) unit 370.

The synapse elements array 310 may include the memristor MEM (refer to FIGS. 1 and 2) and/or may be any one of the synapse element arrays SA1, SA2, and SA3 (refer to FIGS. 6 to 8) as illustrated in FIGS. 6 to 8 described above. Alternatively, the synapse elements array 310 may have a structure in which the synapse elements SE1, SE2, and/or SE3 (refer to FIGS. 6 to 8) as illustrated in FIGS. 6 to 8 are arranged in rows and columns. In FIG. 9, the word line WL and the bit line BL connected to the synapse elements array 310 are illustrated as one, but this is only for reducing the complexity of the drawing, and the word line WL and the bit line BL of FIG. 9 may refer to the word lines WL and the bit lines BL connected to each of the synapse elements SE1, SE2, and/or SE3 included in the synapse elements array 310.

The word line bias unit 320 may receive input data from the control logic unit 340, and may transfer the input data to each of the synapse elements SE1, SE2, and/or SE3 through the word line WL. In addition, the word line bias unit 320 may supply the current for writing the weight to a plurality of synapse elements SE1, SE2, and/or SE3 included in the synapse elements array 310 through the word line WL. In some embodiments, the word line bias unit 320 may include, for example, a digital-to-analog converter (DAC) and/or may be configured to apply inputs from a power circuit (e.g., a current and/or voltage generator (not illustrated)) to the synapse elements array 310.

The bit line bias and detection unit 330 may bias the bit line BL to the ground voltage when performing the artificial neural network operation in each of the plurality of synapse elements SE1, SE2, and/or SE3 included in the synapse elements array 310. In addition, the bit line bias and detection unit 330 may obtain an operation result of the plurality of synapse elements SE1, SE2, and/or SE3 included in the synapse elements array 310 by detecting an amount of the current through the bit line BL.

In addition, the bit line bias and detection unit 330 may receive a bit line address from the control logic unit 340 and may select a column on the synapse elements array 310 corresponding to the bit line address, and may allow the input data to be provided to the synapse elements SE1, SE2, and/or SE3 corresponding to a row selected therefrom. In addition, the bit line bias and detection unit 330 may convert a result output from the synapse elements array 310 into a digital value and may transfer the converted digital value to the control logic unit 340. For example, in some embodiments, the bit line bias and detection unit 330 may include an analog-to-digital converter (ADC).

The control logic unit 340 may read information stored in the nonvolatile memory 350 and control the word line bias unit 320 and the bit line bias and detection unit 330, based on the read information. Also, the control logic unit 340 may transfer an initial input received through the input/output unit 370 as the input data to the word line bias unit 320 and/or may store the initial input in the volatile memory 360.

In addition, the control logic unit 340 may transfer a result output from the synapse elements array 310 as the input data to the word line bias unit 320 or may store it in the volatile memory 360. In some embodiments, the control logic unit 340 may include and/or be included in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc.

The nonvolatile memory 350 may store information on a connection relationship among the plurality of synapse elements SE1, SE2, and/or SE3 included in the synapse elements array 310. For example, the nonvolatile memory 350 may store information on which initial input should be provided to which element(s) among the plurality of synapse elements SE1, SE2, and/or SE3 included in the synapse elements array 310. Alternatively, the nonvolatile memory 350 may store information on which the result output from the synapse elements array 310 should be provided to which element(s) among the plurality of synapse elements SE1, SE2, and/or SE3 included in the synapse elements array 310. In some embodiments, the nonvolatile memory 350 may include information on the entire structure of the artificial neural network implemented by the neuromorphic processor 300.

The volatile memory 360 may store the initial input received from the input/output unit 370 and/or a result output from the synapse elements array 310. The input/output unit 370 may receive the initial input from the outside and may transfer it to the control logic unit 340. In addition, the input/output ("I/O") unit 370 may receive a result output from the synapse elements array 310 from the control logic unit 340 and may output it to the outside. For example, the I/O unit 370 may include at least one of a keyboard, a key panel, a touch panel, a camera, a microphone, a network connection, a screen, a speaker, a haptic feedback generator, etc. Though the I/O unit 370 is illustrated as one unit, this is only for reducing the complexity of the drawing. For example, the I/O unit 370 may include one or more separate (e.g., a key board and a screen and/or a speaker and microphone) and/or integrated devices (e.g., a touch screen).

According to some embodiments of the present disclosure, a memristor element, a synapse element, and/or a neuromorphic processor may improve the operating speed of elements and processors, may reduce power consumption, and may secure high endurance by using the movement of the domain wall by the spin orbit torque (SOT).

While the present disclosure has been described with reference to some example embodiments thereof, it will be apparent to those of ordinary skill in the art that various changes and modifications may be made thereto without departing from the spirit and scope of the present disclosure as set forth in the following claims.

What is claimed is:

1. A memristor element comprising:
a free layer including a domain wall; and
a fixed layer including a material of which a magnetization direction is fixed,
wherein a position of the domain wall in the free layer is changeable based on a spin orbit torque (SOT) generated by a current injected to the fixed layer from an outside through a first position and output through a second position such that the current traverses through the fixed layer, and
wherein a resistance value of the fixed layer between the first and second positions is based on the position of the domain wall and on a Hall voltage,
wherein the Hall voltage is based on the position of the domain wall,
wherein the Hall voltage has at least a lower value, a higher value, and an intermediate value,
wherein the memristor element is configured to store non-binary data based the resistance value, and
wherein a direction of the domain wall position change is parallel to a direction of the injected current that causes the domain wall position to change.

2. The memristor element of claim 1, further comprising:
a first electrode configured to accept the current introduced from the outside; and
a second electrode configured to provide a voltage pulse to the outside.

3. The memristor element of claim 1, wherein the free layer includes a synthetic antiferromagnet (SAF) material.

4. The memristor element of claim 1, wherein the fixed layer includes at least one of a metal iridate or an oxidized layer of a ferromagnet (FM)/heavy metal bilayer.

5. The memristor element of claim 1, further comprising:
a spin orbit torque writing line with a direction of spin parallel to a magnetization direction of the free layer.

6. The memristor element of claim 1, further comprising:
a spin orbit torque writing line with a direction of spin perpendicular to a magnetization direction of the free layer.

7. A synapse element comprising:
at least one transistor; and
at least one memristor element electrically connected to the at least one transistor and configured to store a weight for an artificial neural network operation, and
wherein the at least one memristor element includes
a free layer including a domain wall; and
a fixed layer including a material of which a magnetization direction is fixed, and
wherein a position of the domain wall is changeable based on a spin orbit torque (SOT) generated by a current injected to the fixed layer from an outside through a first position and output through a second position such that the current traverses through the fixed layer,
wherein a resistance value of the fixed layer between the first and second positions is based on the position of the domain wall and on a Hall voltage,
wherein the Hall voltage is based on the position of the domain wall,
wherein the Hall voltage has at least a lower value, a higher value, and an intermediate value,
wherein the memristor element is configured to store non-binary data based the resistance value, and
wherein a direction of the domain wall position change is parallel to a direction of the injected current that causes the domain wall position to change.

8. The synapse element of claim 7, wherein the at least one memristor element further includes:
a first electrode configured to accept the current introduced from the outside; and
a second electrode configured to provide a voltage pulse to the outside.

9. The synapse element of claim 7, wherein
a first terminal of a first transistor, among the at least one transistor, is connected to a word line, a second terminal of the first transistor is connected to a source line, a third terminal of the first transistor is connected to one end of a first memristor element, among the at least one memristor element, and another end of the first memristor element is connected to a bit line.

10. The synapse element of claim 7, wherein one end of a first memristor element, among the at least one memristor element, is connected to a word line, wherein another end of the first memristor element is connected to a first node, wherein one end of a second memristor element, among the at least one memristor element, is connected to the word line, wherein another end of the second memristor element is connected to a second node, wherein a first terminal of a first transistor, among the at least one transistor, is connected to the first node, wherein a second terminal of the first transistor is connected to the second node, wherein a third terminal of the first transistor is connected to a bit line, wherein a first terminal of a second transistor, among the at least one transistor, is connected to the second node, wherein a second terminal of the second transistor is connected to the first node, and wherein a third terminal of the second transistor is connected to the bit line.

11. The synapse element of claim 7, wherein the free layer includes a synthetic antiferromagnet (SAF) material.

12. The synapse element of claim 7, wherein the fixed layer includes at least one of a metal iridate or an oxidized layer of a ferromagnet (FM)/heavy metal bilayer.

13. A neuromorphic processor comprising:

a synapse element array including a plurality of synapse elements, wherein each of the plurality of synapse elements includes a first memristor element including a free layer including a domain wall, and a fixed layer including a material of which a magnetization direction is fixed, wherein a position of the domain wall in the free layer is changeable based on a spin orbit torque (SOT) generated by a current injected to the fixed layer from an outside through a first position and output through a second position such that the current traverses through the fixed layer, wherein a resistance value of the fixed layer between the first and second positions is based on the position of the domain wall and on a Hall voltage, wherein the Hall voltage is based on the position of the domain wall, wherein the Hall voltage has at least a lower value, a higher value, and an intermediate value, wherein the memristor element is configured to store non-binary data based the resistance value, and wherein a direction of the domain wall position change is parallel to a direction of the injected current that causes the domain wall position to change.

14. The neuromorphic processor of claim 13, wherein the first memristor element further includes:

a first electrode configured to accept the current introduced from the outside; and a second electrode configured to provide a voltage pulse to the outside.

15. The neuromorphic processor of claim 13, wherein each of the plurality of synapse elements further includes a first transistor, a first terminal of the first transistor is connected to a word line, a second terminal of the first transistor is connected to a source line, a third terminal of the first transistor is connected to one end of the first memristor element, and another end of the first memristor element is connected to a bit line.

16. The neuromorphic processor of claim 15, wherein the neuromorphic processor is configured to supply the current supplied from the outside to the plurality of synapse elements such that the position of the domain wall is moveable based on a signal supplied through the word line, and wherein the resistance value is changed based on the position of the moveable domain wall.

17. The neuromorphic processor of claim 15, wherein the neuromorphic processor is configured to derive a result of an artificial neural network operation based on a current output from the bit line.

18. The neuromorphic processor of claim 13, wherein each of the plurality of synapse elements further includes a first transistor, a second transistor, and a second memristor element, one end of the first memristor element is connected to a word line, another end of the first memristor element is connected to a first node, one end of the second memristor element is connected to the word line, another end of the second memristor element is connected to a second node, a first terminal of the first transistor is connected to the first node, a second terminal of the first transistor is connected to the second node, a third terminal of the first transistor is connected to a bit line, a first terminal of the second transistor is connected to the second node, a second terminal of the second transistor is connected to the first node, and a third terminal of the second transistor is connected to the bit line.

19. The neuromorphic processor of claim 13, wherein the free layer includes a synthetic antiferromagnet (SAF) material.

20. The neuromorphic processor of claim 13, wherein the fixed layer includes at least one of a metal iridate or an oxidized layer of a ferromagnet (FM)/heavy metal bilayer.

* * * * *